United States Patent
Imaizumi et al.

(10) Patent No.: US 11,372,719 B1
(45) Date of Patent: Jun. 28, 2022

(54) MEMORY SYSTEM

(71) Applicant: Kioxia Corporation, Tokyo (JP)

(72) Inventors: Yasuyuki Imaizumi, Yokohama Kanagawa (JP); Tokumasa Hara, Kawasaki Kanagawa (JP); Toshiyuki Yamagishi, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/367,189

(22) Filed: Jul. 2, 2021

(30) Foreign Application Priority Data

Dec. 25, 2020 (JP) .............................. JP2020-217736

(51) Int. Cl.
*G06F 11/00* (2006.01)
*G06F 11/10* (2006.01)
*G06F 3/06* (2006.01)
*H03M 13/29* (2006.01)

(52) U.S. Cl.
CPC ........ *G06F 11/1068* (2013.01); *G06F 3/0619* (2013.01); *G06F 3/0659* (2013.01); *G06F 3/0679* (2013.01); *H03M 13/2906* (2013.01)

(58) Field of Classification Search
CPC .. G06F 11/1068; G06F 3/0619; G06F 3/0659; G06F 3/0679; H03M 13/2906
See application file for complete search history.

(56) References Cited

U.S. PATENT DOCUMENTS

| | | | |
|---|---|---|---|
| 9,197,247 B2 | 11/2015 | Kim et al. | |
| 9,778,985 B1* | 10/2017 | Kim | G11C 16/10 |
| 10,061,691 B2* | 8/2018 | Lin | G11C 16/0483 |
| 10,691,530 B2 | 6/2020 | Kim | |
| 2015/0254136 A1* | 9/2015 | Hoya | G06F 11/1012 714/764 |
| 2015/0269992 A1* | 9/2015 | Hara | G11C 11/5642 365/185.03 |
| 2016/0224419 A1* | 8/2016 | Takai | G06F 3/0679 |
| 2018/0074730 A1* | 3/2018 | Inoue | G06F 3/0659 |
| 2018/0260274 A1* | 9/2018 | Inoue | G06F 12/10 |
| 2019/0294500 A1* | 9/2019 | Hara | G06F 11/1072 |
| 2020/0012554 A1 | 1/2020 | Motwani et al. | |
| 2020/0264805 A1* | 8/2020 | Yoshii | G06F 3/0679 |

OTHER PUBLICATIONS

X. Zhongyuan and Z. Feng, "A dynamic reprogramming scheme to enhance the reliability of RRAM," 2015 IEEE 11th International Conference on ASIC (ASICON), 2015, pp. 1-4, doi: 10.1109/ASICON.2015.7517191. (Year: 2015).*

* cited by examiner

*Primary Examiner* — Daniel F. McMahon
(74) *Attorney, Agent, or Firm* — Foley & Lardner LLP

(57) ABSTRACT

A memory system includes a non-volatile memory including at least one memory cell, a buffer, and a memory controller. The memory controller acquires first data from the buffer. The first data includes a plurality of bits of data. The memory controller generates second data by performing a randomization process on the first data, generates a flag that is information used to identify an error suppression encoding process, based on the second data, and stores the flag in the buffer. The memory controller acquires third data and the flag from the buffer. The third data is 1-bit data of the first data. The memory controller generates storage data by performing the error suppression encoding process based on the acquired flag and the randomization process on the third data, and writes the storage data into the memory cell.

20 Claims, 10 Drawing Sheets

MEMORY SYSTEM

CROSS-REFERENCE TO RELATED APPLICATION(S)

This application is based upon and claims the benefit of priority from Japanese Patent Application No. 2020-217736, filed on Dec. 25, 2020, the entire contents of which are incorporated herein by reference.

FIELD

Embodiments described herein relate generally to a memory system.

BACKGROUND

A memory system that uses a NAND type flash memory (hereinafter, referred to as a NAND memory) for a storage medium may have, for example, an error correction function. The memory system adds parity data to write data before writing to the NAND memory. In this case, it is desirable to efficiently execute the writing.

DETAILED DESCRIPTION

Embodiments provide a memory system capable of efficiently writing data.

In general, according to at least one embodiment, a memory system includes a non-volatile memory including at least one memory cell, a buffer, and a memory controller. The memory controller acquires first data from the buffer. The first data includes a plurality of bits of data. The memory controller generates second data by performing a randomization process on the first data, generates a flag that is information used to identify an error suppression encoding process, based on the second data, and stores the flag in the buffer. The memory controller acquires third data and the flag from the buffer. The third data is 1-bit data of the first data. The memory controller generates storage data by performing the error suppression encoding process based on the acquired flag, and the randomization process, on the third data, and writes the storage data into the memory cell.

Hereinarter, the memory system according to the embodiments will be described in detail with reference to the accompanying drawings. Note that the present invention is not limited by these embodiments.

First Embodiment

Figure 1:
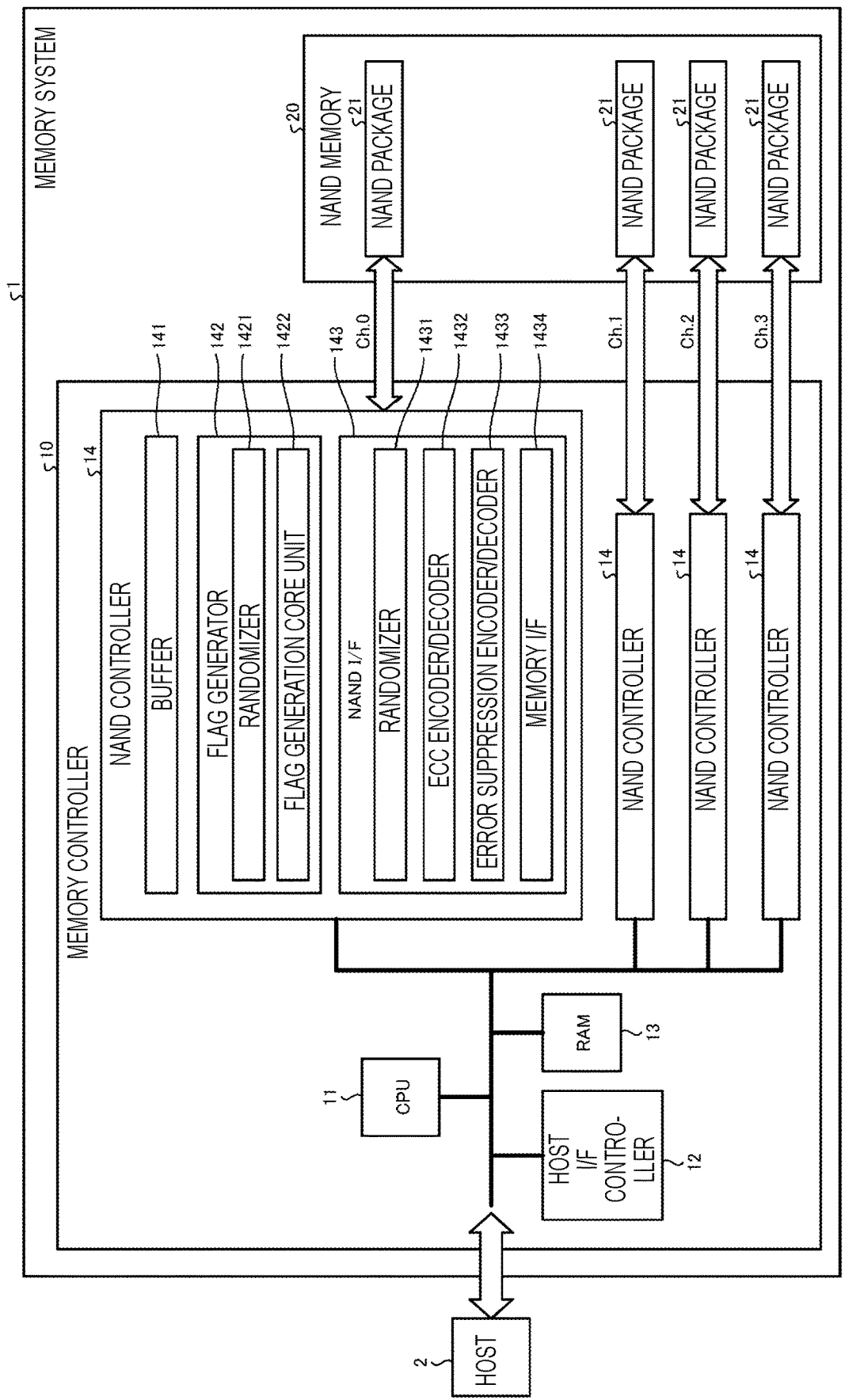
FIG. 1 is a view illustrating an example of the configuration of a memory system according to a first embodiment, in which the memory system is connected to a host.

FIG. 1 is a view illustrating an example of the configuration of a memory system 1 according to a first embodiment, in which the memory system 1 is connected to a host 2. As illustrated in FIG. 1, the memory system 1 includes a memory controller 10 and a NAND-type flash memory 20 (hereinafter, referred to as a "NAND memory 20").

The NAND memory 20 includes one or more NAND packages 21. Each NAND package 21 includes one or more memory chips. Each of the one or more memory chips stores data in a non-volatile manner. The one or more memory chips operate independently from each other, and thus, parallel operations between the memory chips are possible.

The memory chip includes a memory cell array. The memory cell array includes multiple blocks. The block is a set including multiple memory cells (multiple memory cell transistors) associated with a bit line and a word line, and becomes, for example, a unit of a data erase operation. The set including the multiple memory cells associated with the word line is called a memory cell group. Each memory cell is configured to be capable of storing 1 or more bits of data. When the memory cell is a single-level cell (SLC), one memory cell group corresponds to one page. A page is a unit of, for example, a data write operation and a data read operation. When the memory cell is a multiple-level cell (MLC), one memory cell group corresponds to multiple pages. In this description, the MLC includes a triple-level cell (TLC) that stores 3 bits in one memory cell, a quad-level cell (QLC) that stores 4 bits in one memory cell, or a memory cell that stores 5 or more bits in one memory cell.

In the memory system 1, the number of NAND packages 21 in the NAND memory 20 may be any number. Further, the number of memory chips in the NAND package 21 may be any number. Hereinafter, it is assumed, for example, that the number of NAND packages 21 in the NAND memory 20 is four.

Hereinafter, the NAND memory 20 will be described as an example, but the non-volatile memory in the memory system 1 is not limited thereto and may be, for example, another type of memory such as a magnetoresistive random access memory (MRAM), a phase change random access memory (PCRAM), or a resistive random access memory (ReRAM).

The memory controller 10 is, for example, an integrated circuit (IC) such as a system on a chip (SoC), a field programmable gate array (FPGA), or an application specific integrated circuit (ASIC). The memory controller 10 is capable of instructing the NAND memory 20 to perform various operations. The memory controller 10 executes an operation based on a request from the external host 2, and an operation that is not directly requested by the host 2. Each function of the memory controller 10 may be implemented by a central processing unit (CPU) that executes a program, or may be implemented by dedicated hardware, for example.

The memory controller 10 may include a CPU 11, a host interface (I/F) controller 12, a random access memory (RAM) 13, and the same number of NAND controllers 14 as the number of the NAND packages 21.

The CPU 11 controls the overall operation of the memory controller 10. For example, in response to a write request received from the host 2, the CPU 11 issues a write command, and transmits the issued write command to the NAND controller 14. Further, for example, in response to a read request received from the host 2, the CPU 11 issues a read command, and transmits the issued read command to the NAND controller 14.

The RAM 13 is a storage area used as a work area of the CPU 11. The RAM 13 stores, for example, parameters or various management tables for managing the NAND memory 20. The RAM 13 stores, for example, a queue (command queue) of requests from the host 2. The RAM 13 stores an address conversion table for converting a logical address associated with data stored in the NAND memory 20 into a physical address of the NAND memory 20. This address conversion table is stored in, for example, the NAND memory 20, and then, is read at the time of start-up of the memory system 1 and is stored in the RAM 13. As for the RAM 13, a volatile memory such as a static RAM (SRAM) is used. Also, when the data size of the address conversion table is large, the address conversion table may be stored in a dynamic RAM (DRAM) having a larger capacity than the RAM 13.

The host I/F controller 12 is connected to the host 2 to manage a communication between the memory system 1 and the host 2. The host I/F controller 12 controls a transmission of, for example, data, requests, and addresses between the memory system 1 and the host 2. The host I/F controller 12 supports, for example, communication interface standards such as serial advanced technology attachment (SATA), serial attached SCSI (SAS), PCI express (PCIe), or non-volatile memory express (NVMe) (registered trademark). That is, the host 2 connected to the memory system 1 is a computer including, for example, interfaces of SATA, SAS, PCIe, or NVMe.

The four NAND controllers 14 are connected to the different NAND packages 21, respectively, through different channels Ch.0 to Ch.3, respectively. Each of the channels Ch.0 to Ch.3 is configured with a wiring group that includes an input/output signal line and a control signal line. The input/output signal line is, for example, a signal line for transmitting/receiving data, addresses, and commands. The control signal line is, for example, a signal line for transmitting/receiving control signals to control the NAND memory 20.

The four NAND controllers 14 control the different channels Ch.0 to Ch.3, respectively. Further, the NAND controllers 14 execute the control of commands instructed by the CPU 11, for the memory chips in the corresponding NAND packages 21. For example, the NAND controllers 14 write and read user data according to commands instructed by the CPU 11.

Each NAND controller 14 includes a buffer 141, a flag generator 142, and a NAND interface (I/F) 143.

The buffer 141 temporarily stores data received from the host 2. The buffer 141 performs buffering of various data. The buffer 141 is, for example, an SRAM.

The flag generator 142 includes a randomizer 1421 and a flag generation core unit 1422. The flag generator 142 generates a flag to be used in an error suppression encoding process. The flag is information that identifies the error suppression encoding process. Details of a method of generating the flag will be described later.

The NAND I/F 143 includes a randomizer 1431, an error correction code (ECC) encoder/decoder 1432, an error suppression encoder/decoder 1433, and a memory interface (I/F) 1434.

The randomizer 1431 includes, for example, a linear feedback shift register. At the time of writing, the randomizer 1431 performs a randomization process by executing an exclusive OR (EXOR) operation on random data (randomize key) output from a pseudorandom number generator such as the linear feedback shift register, and user data. At the time of reading, the randomizer 1431 executes a derandomization process for canceling the randomization by using the random data having used at the time of writing. The derandomization process is, for example, an inverse conversion of the randomization. This randomization process is executed for the purpose of increasing the reliability of data stored in the NAND memory 20.

The ECC encoder/decoder 1432 encodes and decodes data in order to perform an error detection process and an error correction process on the data. Specifically, the ECC encoder/decoder 1432 performs an error correction encoding process by generating parity data for data to be written into the NAND memory 20. Further, the ECC encoder/decoder 1432 decodes data read from the NAND memory 20. The ECC encoder/decoder 1432 executes an error detection process and an error correction process on the read data through the decoding process using the parity data. When the error correction process fails, the ECC encoder/decoder 1432 notifies the CPU 11 of the failure of the error correction process. Regarding the algorithm of encoding and decoding by the ECC encoder/decoder 1432, any algorithm such as using a reed-solomon (RS) code, a bose-chaudhuri-hocquenghem (BCH) code, a low density parity check (LDPC) code, for example, is applicable.

The error suppression encoder/decoder 1433 performs an error suppression encoding process on user data to be stored in the NAND memory 20. Further, the error suppression encoder/decoder 1433 performs an error suppression decoding on data read from the NAND memory 20. The unit to which the error suppression encoding process is applied may be the entire memory cell array or the word line.

The error suppression encoding process is a process of biasing threshold voltages of memory cells by converting data to be written. As a result of the error suppression encoding process, a cell deterioration may be reduced. The cell deterioration means a deterioration of a memory cell caused by an inter-cell interference effect, write, and erase. Through the error suppression encoding process, it is possible to reduce the number of memory cells to be programmed to a threshold voltage having poor characteristics regarding a bit error rate (BER), and it is possible to increase the number of memory cells to be programmed to a threshold voltage having good characteristics.

An error suppression code is a code used for the error suppression encoding process and is also called an error mitigation code (EMC). An example of the error suppression code is an asymmetric coding. Another example of the error suppression code is a page symmetric coding (PSC). Details of the error suppression encoding process will be described later.

The memory I/F 1434 connects the NAND controller 14 to the NAND package 21 to manage a communication between the NAND controller 14 and the NAND package 21. The memory I/F 1434 is configured based on a NAND interface standard such as a Toggle double data rate (DDR) interface, or an open NAND flash interface (ONFI).

(Error Suppression Encoding Process)

Here, the error suppression encoding process will be described. Hereinafter, a case where a memory cell is a TLC will be described as an example, but the procedure of the error suppression encoding process is identically applicable to other types of memory cells such as a SLC and other MLCs.

Figure 2:
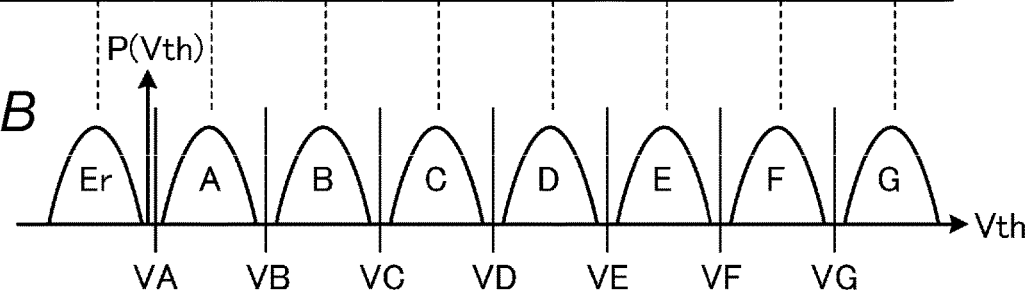
FIGS. 2A and 2B are views illustrating an example of correspondence between threshold voltages of triple-level cells (TLCs) memory cells and data coding in the first embodiment.

FIG. 2A illustrates an example of correspondence between threshold voltages of TLC-memory cells and data coding. FIG. 2B illustrates a threshold voltage distribution of the TLC-memory cells. In FIG. 2B, the horizontal axis indicates a threshold voltage (Vth), and the vertical axis indicates the probability of occurrence (P(Vth)) of a threshold voltage of memory cells when the memory cells are programmed to each of distributions Er to G. Voltages VA to VG indicate read voltages applied to gates of the memory cells at the time of reading.

As illustrated in FIG. 2B, in the case of the TLC-memory cell, the threshold voltage distribution includes eight distributions of the distribution Er, the distribution A, the distribution B, the distribution C, the distribution D, the distribution E, the distribution F, and the distribution G. The distribution Er corresponds to a threshold voltage distribution in an erase state where the threshold voltage is lowest. The threshold voltage increases in the order of the distribution A, the distribution B, the distribution C, . . . , and the distribution G. In the distribution G, the threshold voltage is highest. When TLCs of 3 bits/cell are used, 3-bit data values are associated with the eight threshold voltage distributions Er, A, B, C, D, E, F, and G, respectively. This correspondence is called data coding. That is, according to this data coding, a threshold voltage corresponding to a data value to be stored in each memory cell is determined. At the time of data write (in other words, at the time of data program), electric charges are injected into each memory cell such that the threshold voltage falls within each of the ranges illustrated in FIG. 2B. For example, when data (UPPER, MIDDLE, LOWER)=(1, 1, 0) is written into a certain memory cell, electric charges are injected such that the threshold voltage of the memory cell falls between VA and VB.

In the case of the TLC, data stored in a memory cell group connected to one word line (hereinafter, referred to as word line data) corresponds to data of three pages (hereinafter, data of one page will be referred to as page data). The size of the page data is, for example, 16 KBytes. Each of 3 bits that is stored in each memory cell corresponds to any of these three pages. In the following description, these three pages will be referred to as an UPPER page, a MIDDLE page, and a LOWER page, respectively.

FIG. 2A is a view illustrating an example of data coding. As illustrated in FIG. 2A, the distribution Er corresponds to a data value "111", the distribution A corresponds to a data value "110", the distribution B corresponds to a data value "100", the distribution C corresponds to a data value "000", . . . , and the distribution G corresponds to a data value "101". The data coding illustrated in FIG. 2A is an example. The data coding is not limited to the example of FIG. 2A.

Figure 3:
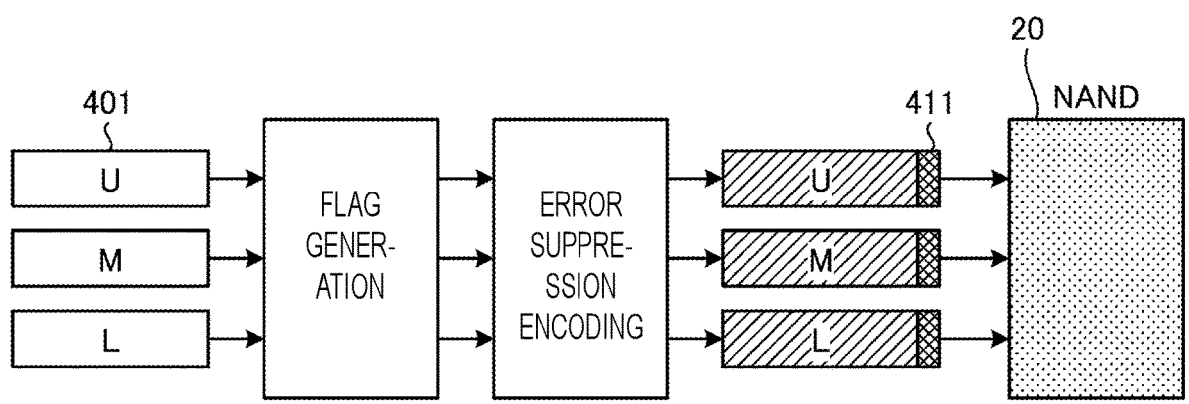
FIG. 3 is a view illustrating the outline of error suppression encoding process in the first embodiment.

Subsequently, the outline of the error suppression encoding process will be described with reference to FIG. 3. In FIG. 3, the symbols "U", "M", and "L" indicate the UPPER page, the MIDDLE page, and the LOWER page, respectively. As illustrated in FIG. 3, the flag generator 142 generates a flag 411 by using user data 401 that is data to be written, and the error suppression encoder/decoder 1433 executes the error suppression encoding process. Then, the error-suppression encoded user data and the flag 411 are written into the NAND memory 20.

The data to be written is not limited to user data acquired from the host. The data to be written may be data obtained from an internal process performed in the memory system 1, such as garbage collection, wear leveling, or refresh process.

Figure 4:
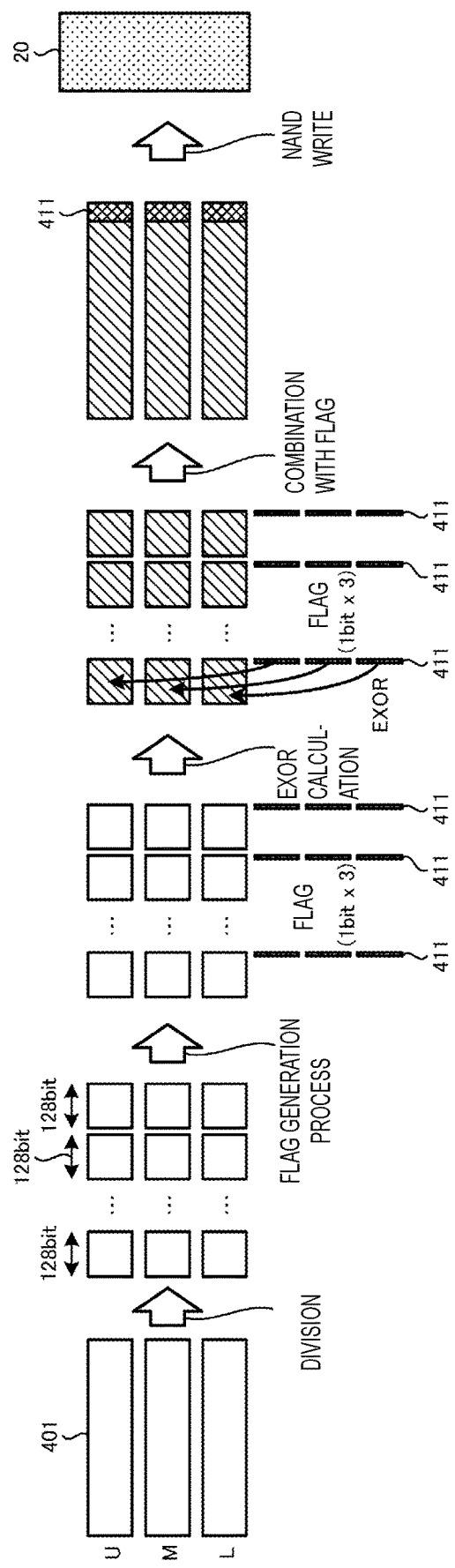
FIG. 4 is a view illustrating details of the error suppression encoding process in the first embodiment.

Subsequently, details of the error suppression encoding process will be described with reference to FIG. 4. In FIG. 4, the symbols "U", "M", and "L" indicate the UPPER page, the MIDDLE page, and the LOWER page, respectively. First, the user data 401 of the UPPER page, the MIDDLE page, and the LOWER page is divided into a certain constant data length (e.g., 128 bits). Then, the flag generator 142 generates the flag 411 of one bit, for each divided user data piece (hereinafter, referred to as segment data).

In the error suppression encoding process, each bit of the user data 401 is encoded based on the above flag, for each piece of segment data. The error suppression encoder/decoder 1433 encodes each bit of the user data 401 by calculating, for example, an exclusive OR (EXOR) operation with the flag 411, for each bit of the user data 401. For example, when the flag 411 is "1", the error suppression encoder/decoder 1433 inverts each bit of the user data 401, and when the flag 411 is "0", the error suppression encoder/decoder 1433 does not invert each bit of the user data 401.

The flag 411 is, for example, a flag for reversibly converting data to be written into the NAND memory 20, into a bit string that unlikely causes an error. The flag generator 142 generates, for example, the flag 411 based on a cost. The cost indicates a possibility of a data error. For example, a smaller cost value indicates that data unlikely causes an error.

The flag generator 142 calculates, for example, a cost based on the following conditions.

(Condition 1) The smaller the number of memory cells programmed into the distribution G illustrated in FIG. 2B, the lower the cost.

(Condition 2) Among memory cells connected to a word line, the smaller the number of locations where memory cells are lined in the order of "distribution G-distribution Er-distribution G", the lower the cost.

That is, the flag generator 142 generates a flag satisfying a condition such as "the distribution G illustrated in FIG. 2B decreases" or "the arrangement of distribution G-distribution Er-distribution G decreases" when an exclusive OR operation on the user data 401 and the flag 411 is executed. In this manner, the flag generator 142 generates the flag 411 based on a cost according to the condition of the threshold voltage.

The cost is calculated based on data to be written into each memory cell. Accordingly, to calculate a cost corresponding to segment data obtained from certain page data, page data of other two pages is also required. That is, in calculating a cost corresponding to segment data obtained from the user data 401 of the LOWER page, the user data 401 of the LOWER page, the user data 401 of the MIDDLE page, and the user data 401 of the UPPER page are required.

When the flag 411 is generated by the flag generator 142, the error suppression encoder/decoder 1433 encodes the user data 401 by executing an exclusive OR operation on the flag 411 and the user data 401. The error suppression encoder/decoder 1433 generates the encoded user data. The flag 411 and the encoded user data are written into the NAND memory 20. For example, the flags 411 generated for pieces of segment data are combined at the end of the encoded user data per page and are written into the NAND memory 20.

Figure 5:
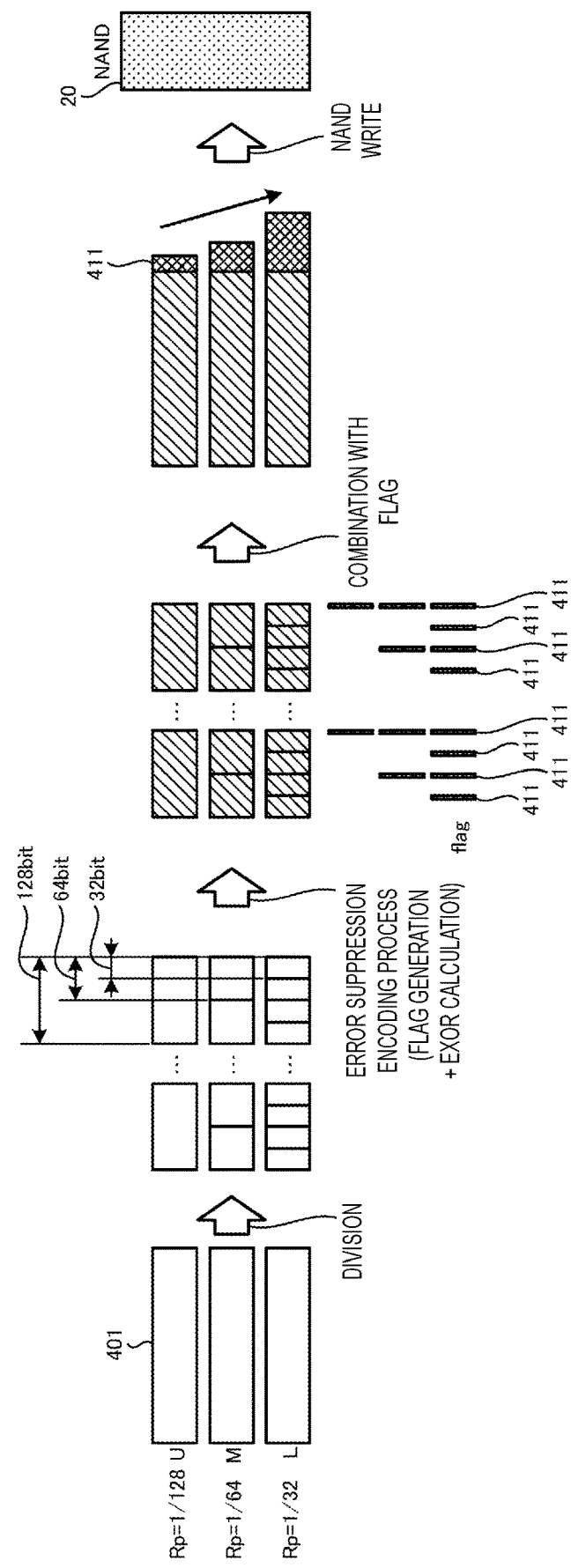
FIG. 5 is a view illustrating another example of the error suppression encoding process in the first embodiment.

Subsequently, another example of the error suppression encoding process will be described with reference to FIG. 5. In FIG. 5, the symbols "U", "M", and "L" indicate the UPPER page, the MIDDLE page, and the LOWER page, respectively. As illustrated in FIG. 5, in another example of the error suppression encoding process, the page data in each of the UPPER page, the MIDDLE page, and the LOWER page is divided by any integer. For example, as illustrated in FIG. 5, the UPPER page is divided by 128 bits. The MIDDLE page is divided by 64 bits. The LOWER page is divided by 32 bits. Then, a cost may be calculated per segment data to generate the flag 411. In this case, since different numbers of pieces of segment data are generated for the pages, and the flags 411 are generated per segment data, the number of flags varies depending on each page.

Here, it is considered that on user data of each of the UPPER page, the MIDDLE page, and the LOWER page, the randomization process is performed, the flag is generated, the error suppression encoding process is performed, and the parity data for error correction process is added, before writing the user data into the NAND memory.

In this case, to reduce the interference effect between the memory cells of the NAND memory 20, after the LOWER page is written into the memory cells connected to the word line first, the UPPER page and the MIDDLE page may be additionally written. In this case, a large buffer (e.g., having a size of three pages) is required in the NAND I/F 143.

Thus, the memory system 1 of at least one embodiment writes data into the NAND memory 20 as described below.

Figure 6:
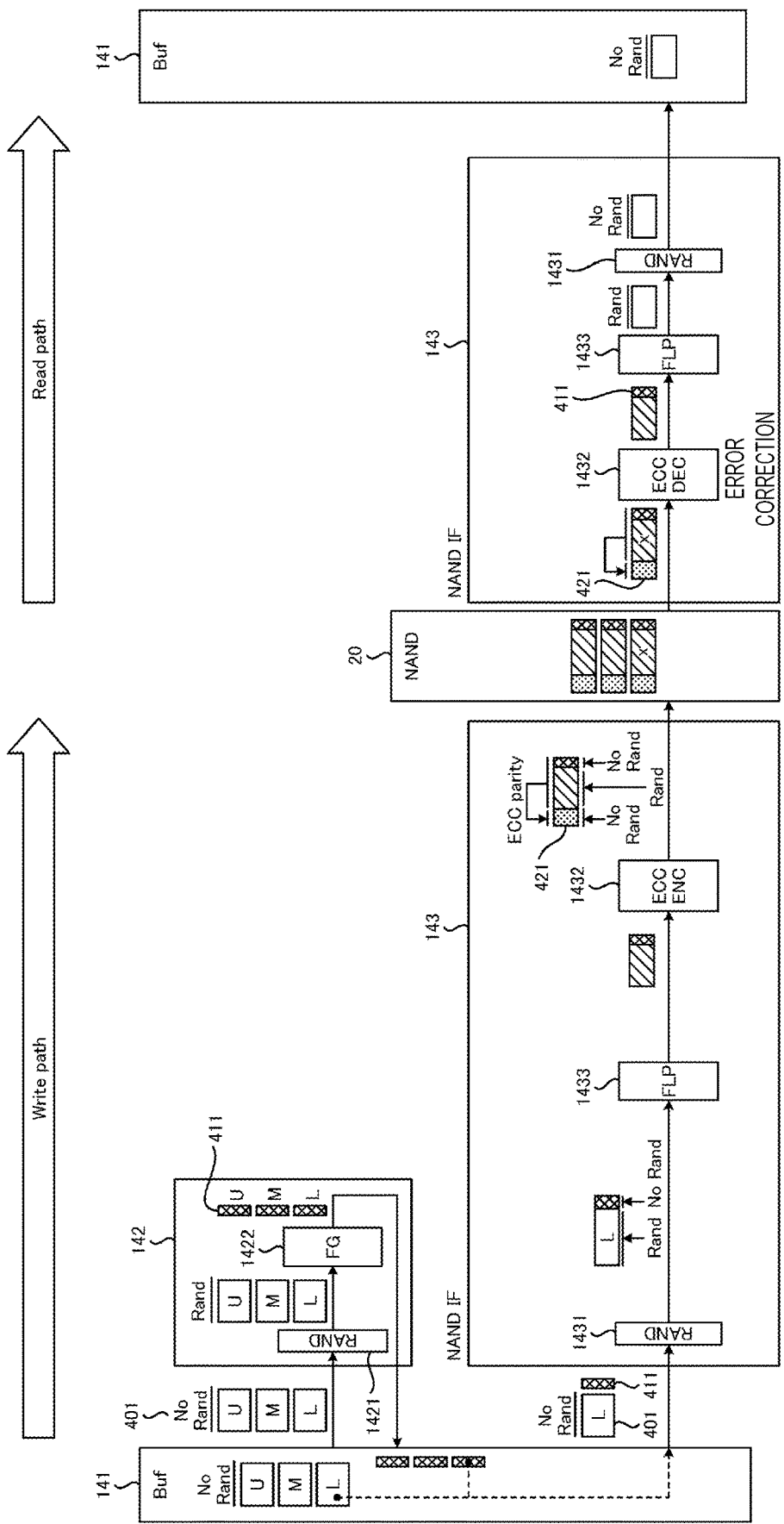
FIG. 6 is a view illustrating the flow of encoding and decoding in the memory system according to the first embodiment.

Next, descriptions will be made on the flow of encoding and decoding in the memory system 1 according to at least one embodiment. FIG. 6 is a view illustrating the flow of encoding and decoding in the memory system 1 according to the first embodiment.

In FIG. 6, the symbols "U", "M", and "L" indicate the UPPER page, the MIDDLE page and the LOWER page, respectively. Data described as "Rand" indicates randomized data. Data described as "No Rand" indicates non-randomized data or derandomized data.

In response to a write request from the host 2, the CPU 11 issues a write command, and transmits the issued write command to the NAND controller 14. The CPU 11 inputs user data of a write target to the buffer 141. Accordingly, the NAND controller 14 performs an encoding process. At the time of the encoding process indicated by "Write path" in the drawing, the flag generator 142 acquires the user data 401 of the UPPER page, the MIDDLE page, and the LOWER page from the buffer 141, and randomizes each piece by the randomizer (RAND) 1421. The flag generation core unit (FG) 1422 of the flag generator 142 generates segment data from the randomized user data 401 of each page, and generates the flag 411 per segment data. The flag generator 142 sends the generated flag 411 to the buffer 141.

The NAND I/F 143 acquires the user data 401 of the LOWER page (the user data 401 per page, on which randomization is not yet performed), and the flag 411 (a flag corresponding to the user data of the LOWER page), from the buffer 141. The randomizer (RAND) 1431 randomizes the user data 401 of the LOWER page using the same random sequence as that used in the randomizer 1421. Here, the randomizer 1431 does not randomize the flag 411. Then, the error suppression encoder/decoder (Flag Flipper (FLP)) 1433 performs the error suppression encoding process on the randomized user data 401 of the LOWER page per segment data, based on the flag 411. Then, the ECC encoder/decoder (ECCENC) 1432 generates parity data (ECC parity) 421 based on the error-suppression encoded user data 401 and the flag 411 acquired from the error suppression encoder/decoder 1433. The NAND I/F 143 writes the error-suppression encoded user data 401, the flag 411, and the parity data 421 into the NAND memory 20.

As described above, the NAND I/F 143 performs the randomization process and the error suppression encoding process per segment data, based on the user data 401 for one page (e.g., the user data 401 of the LOWER page) and the flag 411 corresponding to the user data 401, and writes the error correction-coded user data into the NAND memory 20.

In response to a read request from the host 2, the CPU 11 issues a read command, and transmits the issued read command to the NAND controller 14. Accordingly, the NAND controller 14 performs a decoding process. At the time of the decoding process indicated by "Read path" in the drawing, the ECC encoder/decoder (ECCDEC) 1432 performs an error correction process on data read from the NAND memory 20. Then, the error suppression encoder/decoder (FLP) 1433 decodes the error-corrected data based on the flag 411. Then, the randomizer (RAND) 1431 derandomizes the decoded data, and sends the data to the buffer 141.

Figure 7:
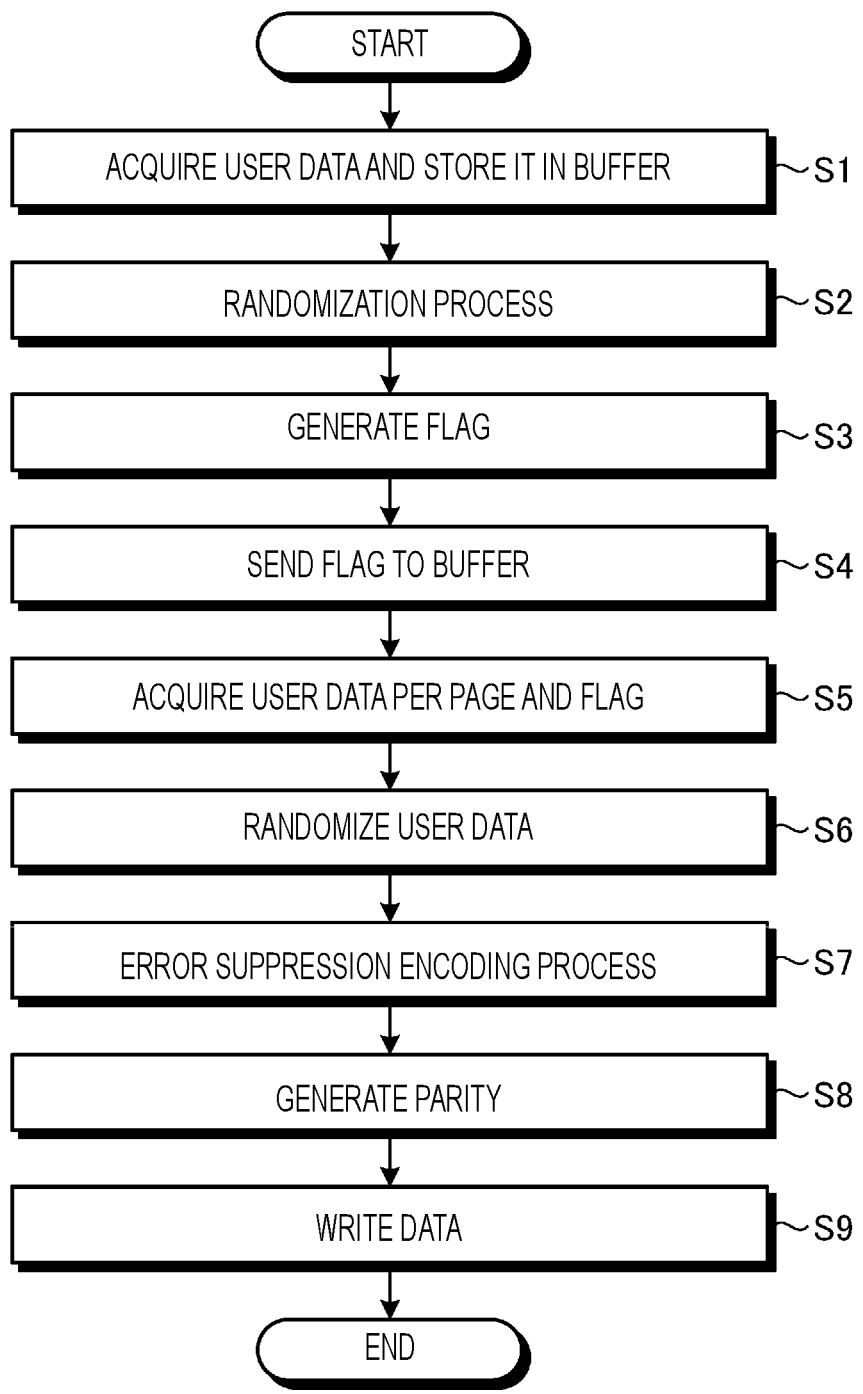
FIG. 7 is a flowchart illustrating a procedure of an encoding process in the first embodiment.

Subsequently, descriptions will be made on a procedure of the encoding process in the memory system 1 according to the first embodiment, by using a flowchart illustrated in FIG. 7. The CPU 11 acquires user data from the host 2 and stores the acquired user data in the buffer 141 (step S1). The flag generator acquires the user data stored in the buffer 141 and randomizes the acquired user data (step S2). The flag generator 142 divides the randomized user data into pieces of segment data, and generates the flag 411 for each piece of segment data (step S3). The flag generator 142 sends the generated flag 411 to the buffer 141 (step S4).

The NAND I/F 143 acquires the user data 401 per page that is not yet randomized, and the flag 411 corresponding to the user data 401, from the buffer 141 (step S5). The randomizer 1431 randomizes the user data 401 (step S6). At this time, the randomizer 1431 does not randomize the flag 411. The error suppression encoder/decoder 1433 performs the error suppression encoding process on the randomized user data 401 per segment data, based on the flag 411 (step S7). The ECC encoder/decoder 1432 generates the parity data 421 based on the error-suppression encoded user data 401, and the flag 411 (step S8). The NAND I/F 143 writes the error-suppression encoded user data 401, the flag 411, and the parity data 421, into the NAND memory 20 (step S9).

As described above, the flag generator 142 of the NAND controller 14 generates the flag 411 for the error suppression encoding process based on the result of randomization process of the user data 401 acquired from the host 2. The NAND controller 14 writes the flag 411, the user data 401 that has been randomized by the randomizer 1431 and subjected to the error suppression encoding process by the error suppression encoder/decoder 1433 per segment data, and the parity data generated by the ECC encoder/decoder 1432, into the NAND memory 20.

The NAND controller 14 generates the flags 411 for the error suppression encoding process by using the user data 401 of three pages, and stores the flags 411 in the buffer 141. Next, the NAND controller 14 acquires the user data 401 of one page from the buffer 141, and the flag 411 corresponding to the acquired user data 401, and performs the randomization process, the error suppression encoding process, and the error correction coding process based on the user data 401 and the flag 411. Accordingly, the NAND controller 14 does not need to have a buffer having a large capacity (e.g., a size of of three pages) in the NAND I/F 143. In this manner, the memory controller 10 may efficiently write data.

(Modification)

In the above-described first embodiment, the randomizer 1431 randomizes the user data 401, the error suppression encoder/decoder 1433 performs the error suppression encoding process on the randomized user data 401 per segment data based on the flag 411, and the ECC encoder/decoder 1432 generates the parity data 421 based on the error-suppression encoded user data 401, and the flag 411. However, this procedure may be modified. For example, the error suppression encoder/decoder 1433 may perform the error suppression encoding process on the non-randomized user data 401 per segment data, based on the flag 411, the ECC encoder/decoder 1432 may generate the parity data 421 based on the error-suppression encoded user data 401, and the flag 411, and the randomizer 1431 may randomize the error-suppression encoded user data 401, the flag 411, and the parity data 421. This is because both the error suppression encoding process by the error suppression encoder/decoder 1433, and the randomization process by the randomizer 1431 are EXOR operations on a per-bit basis, and thus, the procedure may be changed.

Second Embodiment

A memory system of a second embodiment implements an error correction system using a product code. That is, the memory system 1 performs an error correction encoding process of generating multiple types of parity data.

Figure 8:
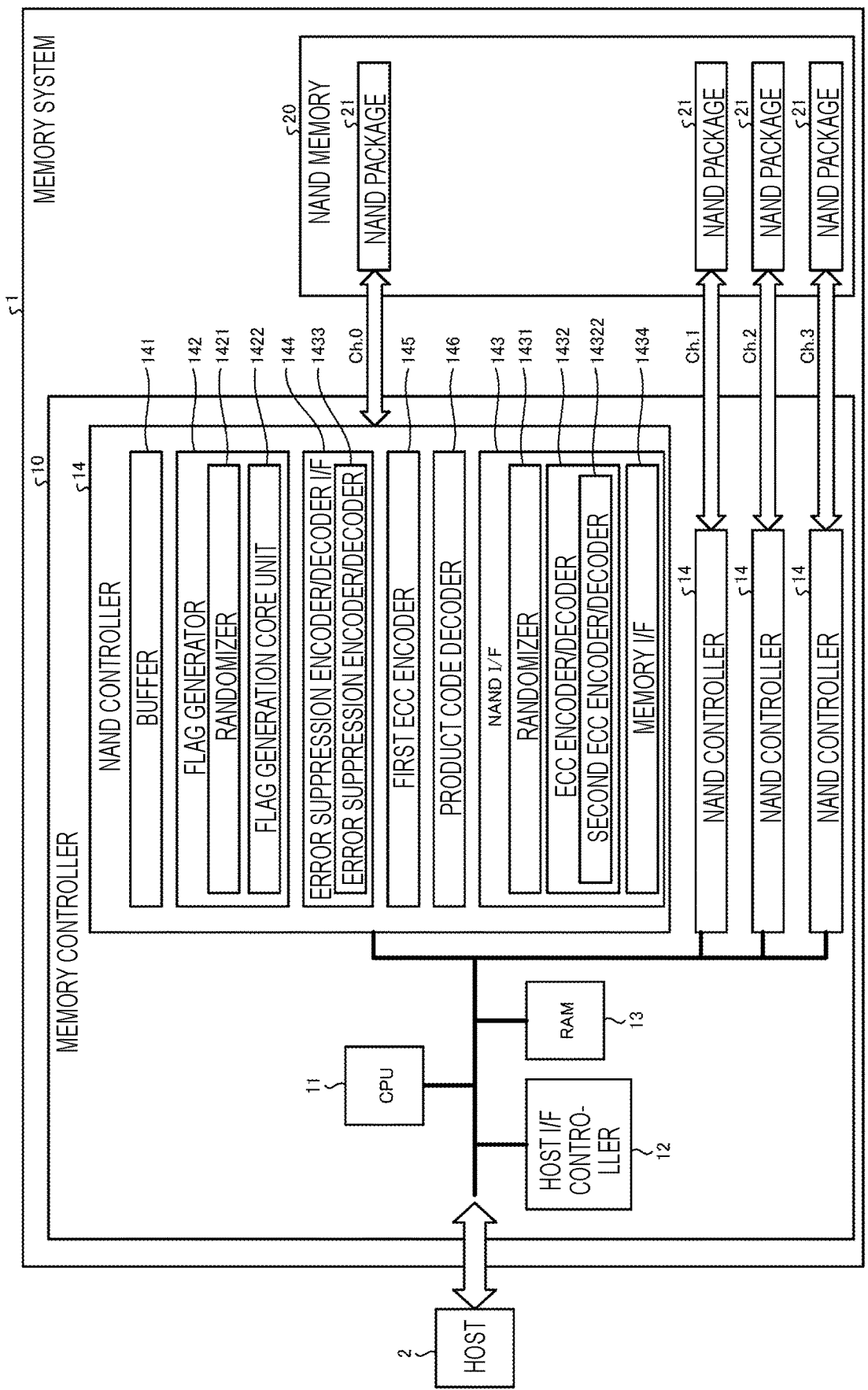
FIG. 8 is a view illustrating an example of the configuration of a memory system according to a second embodiment.

FIG. 8 is a view illustrating an example of the configuration of the memory system 1 according to the second embodiment. As illustrated in FIG. 8, in the second embodiment, an error suppression encoder/decoder interface (I/F) 144 is independent from the NAND I/F 143. Further, a first ECC encoder 145 and a product code decoder 146 are independent from the NAND I/F 143. The error suppression encoder/decoder I/F 144 includes the error suppression encoder/decoder 1433.

The first ECC encoder 145 encodes data for the purpose of error detection process and error correction process on the data. For example, when user data is set as a matrix in which each row corresponds to any of an UPPER page, a MIDDLE page, and a LOWER page, the first ECC encoder 145 generates an error correction code in the column direction. For example, a reed-solomon (RS) code is applied to an algorithm for encoding by the first ECC encoder 145.

The product code decoder 146 decodes data output from the NAND I/F 143. For example, when user data of multiple pages including any of the LOWER page, the UPPER page, and the MIDDLE page are acquired, the product code decoder 146 performs the error detection process and the error correction process in the row direction and the column direction in a case where these user data are set as the matrix.

A second ECC encoder/decoder 14322 encodes data for the purpose of error detection process and error correction process on the data. For example, the second ECC encoder/decoder 14322 generates an error correction code in the row direction in a case where the user data including any of the UPPER page, the MIDDLE page, and the LOWER page is set as the matrix. For example, a bose-chaudhuri-hocquenghem (BCH) code or a low density parity check (LDPC) code is applied to an algorithm for encoding and decoding by the second ECC encoder/decoder 14322.

Figure 9:
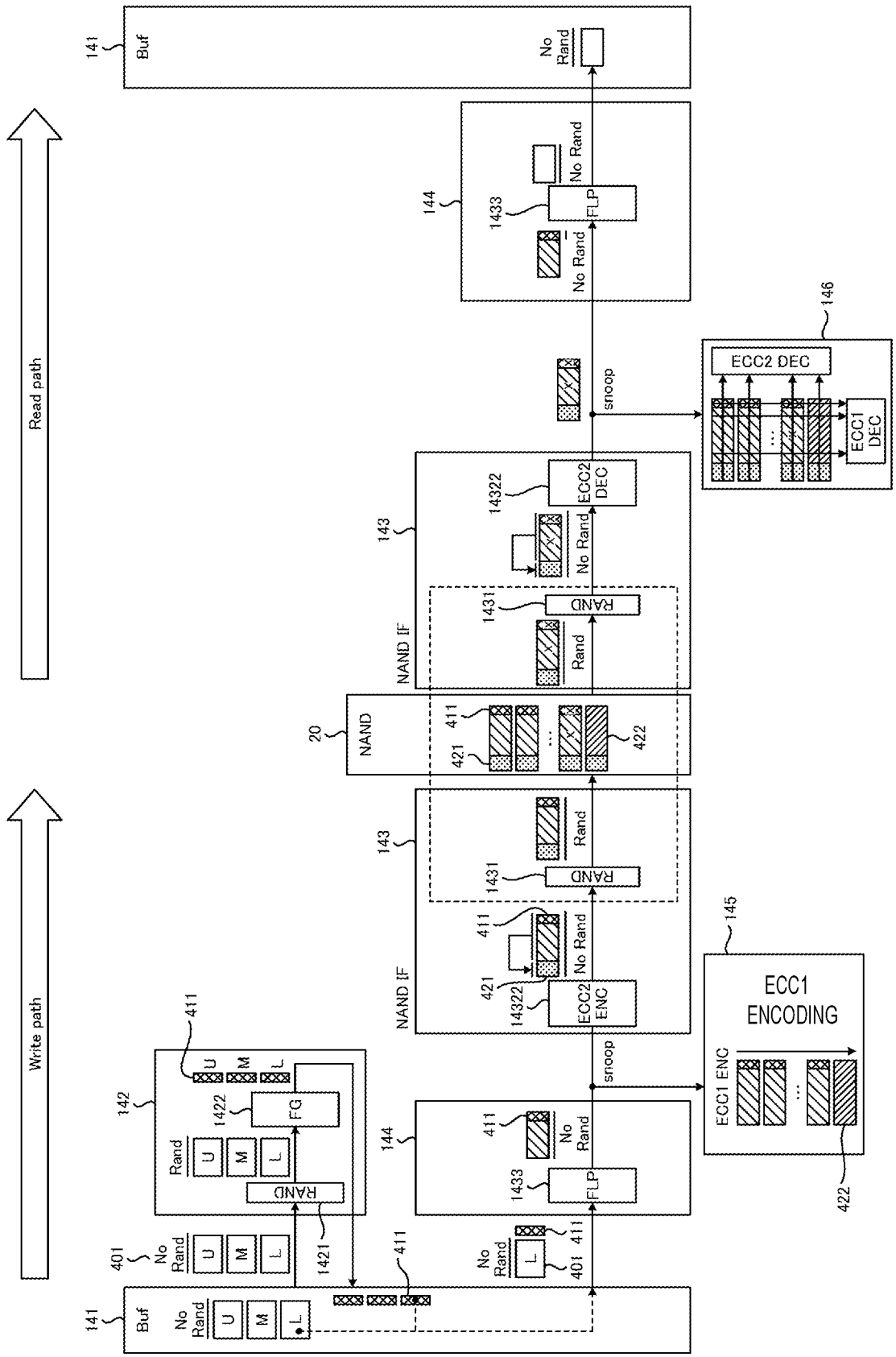
FIG. 9 is a view illustrating the flow of encoding and decoding in the memory system according to the second embodiment.

Next, descriptions will be made on the flow of encoding and decoding in the memory system 1 according to the second embodiment. FIG. 9 is a view illustrating the flow of encoding and decoding in the memory system 1 according to the second embodiment.

In FIG. 9, the symbols "U", "M", and "L" indicate the UPPER page, the MIDDLE page, and the LOWER page, respectively. Data described as "Rand" indicates randomized data. Data described as "No Rand" indicates non-randomized data or derandomized data.

First, at the time of an encoding process indicated by "Write path" in the drawing, the flag generator 142 acquires the user data 401 of the UPPER page, the MIDDLE page, and the LOWER page from the buffer 141, and randomizes each user data by the randomizer (RAND) 1421. The flag generation core unit (FG) 1422 of the flag generator 142 generates segment data from the randomized user data 401 of each page, and generates the flag 411 per segment data. The flag generator 142 sends the generated flag 411 to the buffer 141.

The error suppression encoder/decoder I/F 144 acquires the user data 401 of the LOWER page (the user data 401 per page, on which randomization is not yet performed), and the flag 411 (a flag corresponding to the user data of the LOWER page), from the buffer 141. The error suppression encoder/decoder (FLP) 1433 performs the error suppression encoding process on the non-randomized user data 401 of the LOWER page per segment data, on the basis of the flag 411. The first ECC encoder (ECC1ENC) 145 acquires the error-suppression encoded user data and the flag 411.

The second ECC encoder/decoder (ECC2ENC) 14322 generates the parity data 421 based on the error-suppression encoded user data and the flag 411. The second ECC encoder/decoder (ECC2ENC) 14322 adds the parity data 421 to the corresponding error-suppression encoded user data and the flag 411. The randomizer (RAND) 1431 randomizes the error-suppression encoded user data, the flag 411, and the parity data 421. The NAND I/F 143 writes the randomized user data, the randomized flag 411, and the randomized parity data 421 into the NAND memory 20.

After the above-described process is repeated several times, the first ECC encoder 145 acquires pieces of user data each of which includes any of the UPPER page, the MIDDLE page, and the LOWER page, and the flags 411 corresponding thereto. When the pieces of user data that makeup a product code matrix and the flags 411 corresponding thereto are acquired, the first ECC encoder 145 generates a parity data group 422 in the column direction. The second ECC encoder/decoder (ECC2ENC) 14322 adds the parity data 421 to the parity data group 422. The randomizer (RAND) 1431 randomizes the parity data group 422 and the corresponding parity data 421. The NAND I/F 143 writes the randomized parity data group 422 and the randomized parity data 421 into the NAND memory 20.

At the time of the decoding process indicated by "Read path" in the drawing, the randomizer (RAND) 1431 derandomizes data read from the NAND memory 20. Then, the second ECC encoder/decoder (ECC2ENC) 14322 performs the error correction process based on the parity data 421. The product code decoder 146 acquires the user data that has been subjected to the error correction process by the second ECC encoder/decoder (ECC2ENC) 14322, the flag 411, and the parity data 421.

After the above-described process is repeated several times, the product code decoder 146 acquires pieces of the user data that make up the product code matrix, and the flags 411 and pieces of the parity data 421 corresponding thereto.

The randomizer (RAND) 1431 derandomizes the parity data group 422 read from the NAND memory 20 and the parity data 421 corresponding thereto. The second ECC encoder/decoder (ECC2ENC) 14322 performs the error correction process based on the parity data 421. The product code decoder 146 acquires the parity data group 422 that has been subjected to the error correction process by the second ECC encoder/decoder (ECC2ENC) 14322 and the parity data 421 corresponding thereto.

That is, the product code decoder 146 acquires the pieces of the user data that make up the product code matrix and the flags 411 and the pieces of the parity data 421 corresponding thereto, and the parity data group 422 and the parity data 421 corresponding thereto. The product code decoder 146 performs the error correction process based on the parity data of the parity data 421 and the parity data group 422, by using these data pieces. Then, the error suppression encoder/decoder (FLP) 1433 decodes the error-corrected data by using the flag 411, and sends the decoded data to the buffer 141.

Figure 10:
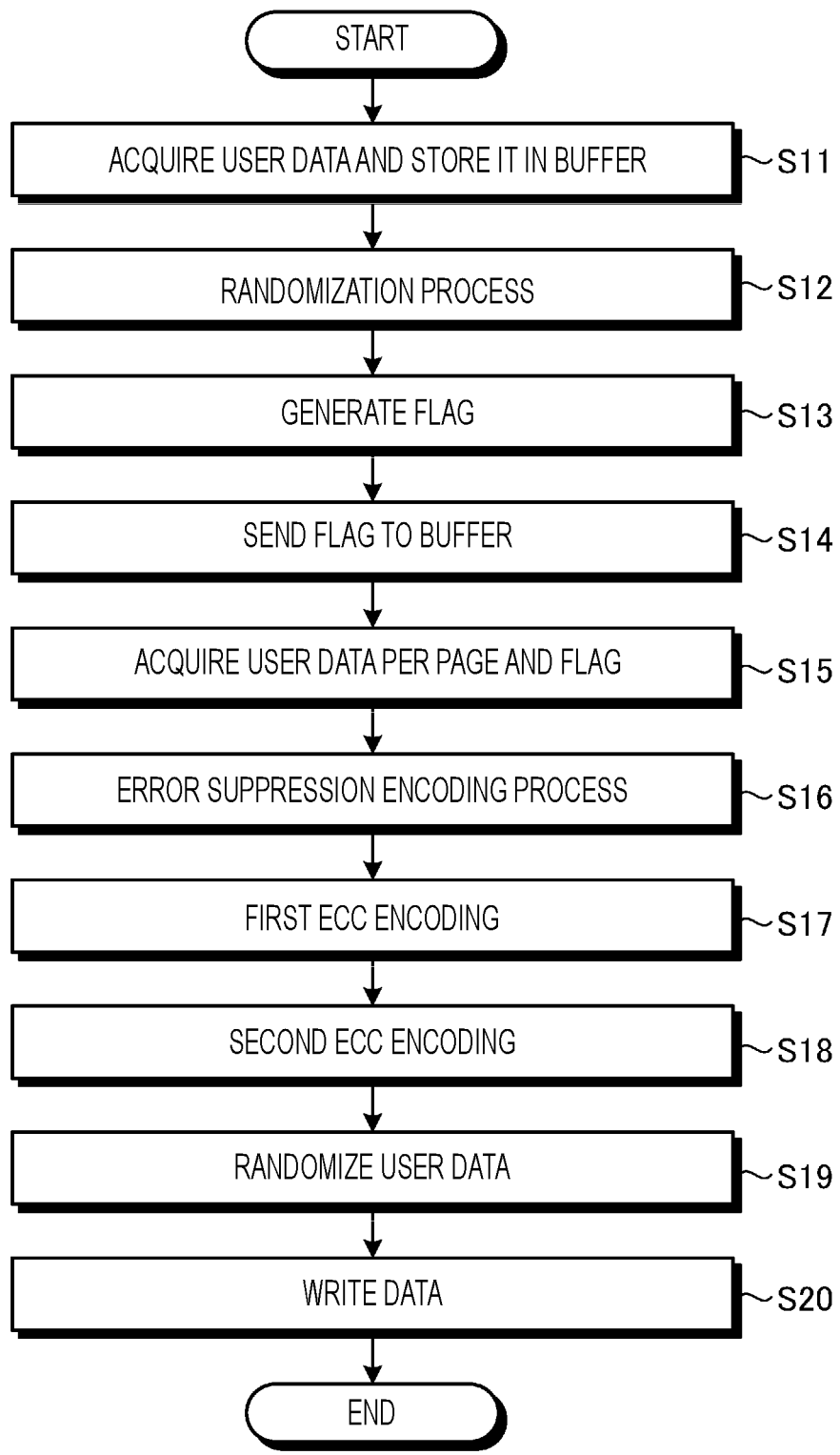
FIG. 10 is a flowchart illustrating a procedure of an encoding process in the second embodiment.

Subsequently, descriptions will be made on a procedure of the encoding process in the memory system 1 according to the second embodiment, by using a flowchart illustrated in FIG. 10. FIG. 10 is a flowchart illustrating a procedure of the encoding process in the second embodiment.

The CPU 11 acquires the user data 401 from the host 2 and stores the acquired user data in the buffer 141 (step S11). The randomizer 1421 of the flag generator 14 acquires the user data 401 stored in the buffer 141 and randomizes the acquired user data 401 (step S12). The flag generation core unit 1422 of the flag generator 142 divides the randomized user data into pieces of segment data, and generates the flag 411 for each piece of segment data (step S13).

The flag generator 142 sends the generated flag 411 to the buffer 141 (step S14). The error suppression encoder/decoder I/F 144 acquires the user data 401 per page and the flag 411 corresponding to the user data 401 from the buffer 141 (step S15). The error suppression encoder/decoder 1433 performs an error suppression encoding process on the user data 401 per segment data, based on the user data 401 and the flag 411 (step S16).

The first ECC encoder 145 acquires a matrix of the error-suppression encoded user data and generates the parity data group 422 in the column direction (step S17). The second ECC encoder/decoder 14322 generates the parity data 421 based on the error-suppression encoded user data 401, the flag 411, and the parity data group 422 (step S18). The randomizer 1431 randomizes the error-suppression encoded data, the flag 411, the parity data group 422, and the parity data 421 (step S19). The NAND I/F 143 writes the randomized data into the NAND memory 20 (step S20).

As described above, the flag generator 142 of the NAND controller 14 generates the flag 411 for the error suppression encoding process based on the result of randomization process of the user data 401 acquired from the host 2. The error suppression encoder/decoder 1433 performs the error suppression encoding process on the user data 401 per segment data, based on the flag 411. The first ECC encoder 145 and the second ECC encoder/decoder 14322 perform the error correction coding process on the user data 401 per page to generate the parity data 421. The randomizer 1431 randomizes the flag 411, the user data 401 per page, and the parity data 421. The NAND controller 14 writes the randomized data into the NAND memory 20.

Since both the error suppression encoding process by the error suppression encoder/decoder 1433 and the randomization process by the randomizer 1431 are EXOR operations on a per-bit basis, the procedure may be changed. Accordingly, the NAND controller 14 performs the randomization process after performing the error suppression encoding process and the error correction coding process. As a result, the NAND controller 14 may also randomize the flag and the parity data. Further, when the NAND controller 14 performs the randomization process at a timing immediately before writing into the NAND memory 20, the influence of the randomizer can be localized. Accordingly, it is possible to prevent an excessive complexity in debugging and product evaluation.

When the randomizer 1431 is disposed in the NAND I/F 143, the CPU 11 can simultaneously set, to the NAND I/F 143, information of multiple pages used when data of the multiple pages is acquired, and multiple randomize keys used when the data of these multiple pages data is randomized by the randomizer 1431. Meanwhile, when the randomizer 1431 is disposed in the error suppression encoder/decoder I/F 144, the CPU 11 needs to set information of multiple pages to the NAND I/F 143, and to set multiple randomize keys to the error suppression encoder/decoder I/F 144. Then, the error suppression encoder/decoder I/F 144 also has to perform correspondence processes between the page data received from the buffer 141 and the randomize keys. This complicates the overall process.

When an error correction system using a product code is provided, it is desirable that the first ECC encoder 145 and the product code decoder 146, which do not need to be provided for each channel, are separated from the NAND I/F 143 that is provided for each channel.

When the decoding process is performed by the error suppression encoder/decoder 1433 on data on which the error correction process has not been performed, an increase of error is caused. Therefore, the error correction process by the second ECC encoder/decoder 14322 and the product code decoder 146 should be performed prior to the decoding process by the error suppression encoder/decoder 1433. That is, the error correction process by the second ECC encoder/decoder 14322 and the product code decoder 146 should target the error-suppression encoded data. Accordingly, at the time of writing, after the error suppression encoding process is performed first by the error suppression encoder/decoder 1433, the error correction encoding process should be performed by the first ECC encoder 145 and the second ECC encoder/decoder 14322.

In the NAND controller 14 according to the second embodiment, based on the flag 411 and the user data 401 per page, data, on which error suppression encoding process has been performed by the error suppression encoder/decoder 1433, error correction encoding process has been performed by the first ECC encoder 145 and the second ECC encoder/decoder 14322, and randomization process has been performed by the randomizer 1431, is written into the NAND memory 20. Thus, it is possible to efficiently write data without complicating the configuration.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a non-volatile memory including at least one memory cell;
a buffer; and
a memory controller configured to:
acquire first data from the buffer, the first data including a plurality of bits of data,
generate second data by performing a randomization process on the first data,
generate a flag, the flag being information used to identify an error suppression encoding process, based on the second data,
store the flag in the buffer,
acquire third data and the flag from the buffer, the third data being 1-bit data of the first data,
generate storage data by performing the error suppression encoding process based on the acquired flag, and the randomization process, on the third data, and
write the storage data into the memory cell.

2. The memory system according to claim 1, wherein the memory controller is further configured to:
generate fourth data by performing the randomization process on the third data, and
generate the storage data by performing the error suppression encoding process based on the acquired flag, on the fourth data.

3. The memory system according to claim 1, wherein the memory controller is further configured to:
generate fifth data by performing the error suppression encoding process based on the acquired flag, on the third data, and
generate the storage data by performing the randomization process on the fifth data.

4. The memory system according to claim 1, wherein the at least one memory cell comprises a plurality of memory cells, the plurality of memory cells being configured to store data of a plurality of pages, and
the memory controller is further configured to:
acquire sixth data from the buffer, the sixth data being data of a plurality of pages,
generate seventh data by performing the randomization process on the sixth data,
generate the flag based on the seventh data,
store the flag in the buffer,
acquire eighth data and the flag from the buffer, the eight data being data of one page in the sixth data, and
generate the storage data by performing the error suppression encoding process based on the acquired flag and the randomization process, on the eighth data.

5. The memory system according to claim 4, wherein the memory controller is further configured to:
divide the sixth data into a plurality of pieces of data segments, and
generate the flag per data segment.

6. The memory system according to claim 5, wherein the plurality of pieces of data segments for different pages of the plurality of pages have a different size.

7. The memory system according to claim 4, wherein the memory controller is further configured to:
generate ninth data by performing the error suppression encoding process based on the acquired flag, on the eighth data,
generate a first error correction code for at least a part of the ninth data,
generate a second error correction code for data including a part of each of a plurality of pieces of data of the ninth data, and
generate the storage data by randomizing the ninth data, the first error correction code, and the second error correction code.

8. The memory system according to claim 1, wherein the memory cell is configured to store data according to a threshold voltage thereof, and
the memory controller is configured to generate the flag based on a cost, the cost indicating a possibility of a data error according to a condition of the threshold voltage of the memory cell.

9. The memory system according to claim 1, wherein the memory controller is configured to perform the error suppression encoding process on the third data by calculating an exclusive OR operation on the flag and the third data.

10. The memory system according to claim 1, wherein the memory controller is configured to perform the randomization process before and after generating the flag.

11. A method of controlling a non-volatile memory, the non-volatile memory including at least one memory cell, the method comprising:
acquiring first data from a buffer, the first data including a plurality of bits of data;
generating second data by performing a randomization process on the first data;
generating a flag, the flag being information used to identify an error suppression encoding process, based on the second data;
storing the flag in the buffer;
acquiring third data and the flag from the buffer, the third data being 1-bit data of the first data;
generating storage data by performing the error suppression encoding process based on the acquired flag and the randomization process, on the third data; and
writing the storage data into the memory cell.

12. The method according to claim 11, further comprising:
generating fourth data by performing the randomization process on the third data; and
generating the storage data by performing the error suppression encoding process based on the acquired flag, on the fourth data.

13. The method according to claim 11, further comprising:
generating fifth data by performing the error suppression encoding process based on the acquired flag, on the third data; and
generating the storage data by performing the randomization process on the fifth data.

14. The method according to claim 11, wherein the at least one memory cell comprises a plurality of memory cells, the plurality of memory cells being configured to store data of a plurality of pages, and
the method further comprises:
acquiring sixth data from the buffer, the sixth data being data of a plurality of pages;
generating seventh data by performing the randomization process on the sixth data;
generating the flag based on the seventh data;
storing the flag in the buffer;
acquiring eighth data and the flag from the buffer, the eight data being data of one page in the sixth data; and generating the storage data by performing the error suppression encoding process based on the acquired flag and the randomization process, on the eighth data.

15. The method according to claim 14, further comprising:
    dividing the sixth data into a plurality of pieces of data segments; and
    generating the flag per data segment.

16. The method according to claim 15, wherein the plurality of pieces of data segments for different pages of the plurality of pages have a different size.

17. The method according to claim 14, further comprising:
    generating ninth data by performing the error suppression encoding process based on the acquired flag, on the eighth data;
    generating a first error correction code for at least a part of the ninth data;
    generating a second error correction code for data including a part of each of a plurality of pieces of data of the ninth data; and
    generating the storage data by randomizing the ninth data, the first error correction code, and the second error correction code.

18. The method according to claim 11, wherein the memory cell is configured to store data according to a threshold voltage thereof, and the flag is generated based on a cost, the cost indicating a possibility of a data error according to a condition of the threshold voltage of the memory cell.

19. The method according to claim 11, wherein the error suppression encoding process is performed on the third data by calculating an exclusive OR operation on the flag and the third data.

20. The method according to claim 11, wherein the randomization process is performed before and after generating the flag.

* * * * *